(12) United States Patent
Kim et al.

(10) Patent No.: US 9,070,890 B2
(45) Date of Patent: Jun. 30, 2015

(54) PIXEL AND ORGANIC LIGHT EMITTING DISPLAY DEVICE HAVING THE SAME

(71) Applicant: SAMSUNG DISPLAY CO., LTD., Yongin-si, Gyeonggi-do (KR)

(72) Inventors: Taegon Kim, Cheonan-si (KR); SeongYeun Kang, Cheonan-si (KR); Kouang Hoon Min, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 13/737,880

(22) Filed: Jan. 9, 2013

(65) Prior Publication Data

US 2014/0014912 A1    Jan. 16, 2014

(30) Foreign Application Priority Data

Jul. 10, 2012   (KR) .................. 10-2012-0075166

(51) Int. Cl.
*H01L 33/00* (2010.01)
*H01L 51/50* (2006.01)
*H01L 33/08* (2010.01)
*H01L 27/32* (2006.01)

(52) U.S. Cl.
CPC .............. *H01L 51/50* (2013.01); *H01L 33/08* (2013.01); *H01L 27/3276* (2013.01)

(58) Field of Classification Search
CPC . H01L 27/3246; H01L 27/3244; H01L 33/08; H01L 27/3276; H01L 51/50; G09G 3/3233
See application file for complete search history.

(56) References Cited

U.S. PATENT DOCUMENTS

| 8,222,808 | B2  |   | 7/2012 | Kitazume et al. |          |
|-----------|-----|---|--------|-----------------|----------|
| 2007/0103406 | A1 | * | 5/2007 | Kim ............................. | 345/76 |
| 2010/0220040 | A1 |   | 9/2010 | Kwak et al. |          |
| 2011/0147769 | A1 | * | 6/2011 | Kang et al. ..................... | 257/88 |
| 2013/0049024 | A1 | * | 2/2013 | Choi et al. ..................... | 257/88 |

FOREIGN PATENT DOCUMENTS

JP   2010-287319 A   12/2010
KR   10-2010-0098860 A   9/2010

* cited by examiner

*Primary Examiner* — Whitney T Moore
*Assistant Examiner* — Joseph Galvin, III
(74) *Attorney, Agent, or Firm* — Christie, Parker & Hale LLP (57) ABSTRACT

A pixel of an organic light emitting display device includes a transistor configured to output a first source voltage, an organic light emitting diode coupled to the transistor, and a wiring configured to be applied with a reference voltage to ground a leakage current of the transistor. The organic light emitting diode includes a first electrode configured to receive the first source voltage, a first common layer on the first electrode, an organic light emitting layer on the first common layer, and a second electrode on the organic light emitting layer and configured to be applied with a second source voltage different from the first source voltage. The first common layer is coupled to the wiring.

20 Claims, 11 Drawing Sheets

PIXEL AND ORGANIC LIGHT EMITTING DISPLAY DEVICE HAVING THE SAME

CROSS-REFERENCE TO RELATED APPLICATION

This application claims priority to and the benefit of Korean Patent Application No. 10-2012-0075166, filed on Jul. 10, 2012, in the Korean Intellectual Property Office, the disclosure of which is incorporated herein in its entirety by reference.

BACKGROUND

1. Field of Disclosure

The present disclosure relates to a pixel and an organic light emitting display device having the same. More particularly, the present disclosure relates to a pixel capable of improving image display quality and an organic light emitting display device having the pixel.

2. Description of the Related Art

An organic light emitting display device includes a plurality of pixels each having an organic light emitting diode. The organic light emitting diode includes an organic light emitting layer that emits light and electrodes that apply a driving voltage to the organic light emitting diode. In addition, common layers are disposed between the organic light emitting diode and the electrodes.

Each pixel includes at least one transistor and at least one capacitor. The transistor applies the driving voltage to the organic light emitting diode. The capacitor maintains the driving voltage, which is applied to the organic light emitting diode, during one frame period.

During a turn-on period of the transistor, each pixel emits light, and each pixel does not emit light during a turn-off period of the transistor. However, when the transistor is turned off, a leakage current may occur in the turned-off transistor. As a result, a pixel emits light due to the leakage current generated by a corresponding transistor during the turn-off period of the transistor.

SUMMARY

The present disclosure provides a pixel capable of preventing or reducing leakage current and improving image display quality.

The present disclosure provides an organic light emitting display device having the pixel.

Embodiments of the inventive concept provide a pixel including a transistor, an organic light emitting diode, and a wiring applied with a reference voltage to ground a leakage current of the transistor. The transistor outputs a first source voltage and the organic light emitting diode is connected to the transistor.

The organic light emitting diode includes a first electrode that receives the first source voltage, a first common layer disposed on the first electrode, an organic light emitting layer disposed on the first common layer, and a second electrode disposed on the organic light emitting layer and applied with a second source voltage different from the first source voltage. The first common layer is connected to the wiring.

The first common layer includes a hole injection layer, and the first common layer further includes a hole transport layer disposed between the hole injection layer and the organic light emitting layer. The wiring is disposed on a same layer as the first electrode.

Embodiments of the inventive concept provide an organic light emitting display device includes a substrate that includes a plurality of scan lines and a plurality of data lines insulated from the scan lines while crossing the scan lines and a plurality of pixels.

Each of the pixels includes an organic light emitting diode applied with a first source voltage and a second source voltage lower than the first source voltage to emit light. Each of the pixels is connected to a corresponding scan line of the scan lines and a corresponding data line of the data lines.

According to the above, the pixel includes the organic light emitting diode and the transistor applying the first source voltage to the organic light emitting diode. The organic light emitting diode includes the first electrode connected to the transistor, the first common layer disposed on the first electrode, and the organic light emitting layer disposed on the first common layer.

The first common layer receives the reference voltage. The first common layer is connected to the common line applied with the reference voltage. The leakage current generated in the transistor while the transistor is turned off is grounded to the common line through the first common layer. Accordingly, the pixel does not emit the light even though the leakage current occurs.

BRIEF DESCRIPTION OF THE DRAWINGS

The above and other aspects of the present invention will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations), and the spatially relative descriptors used herein are interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
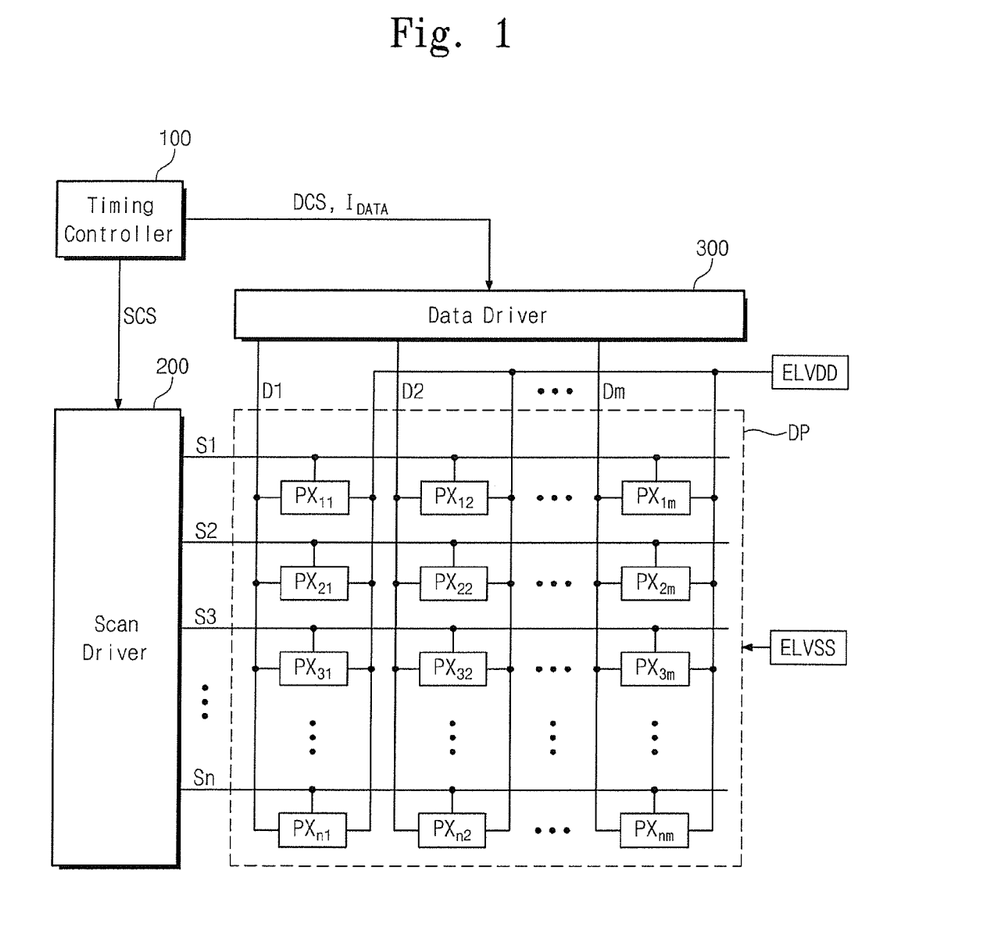
FIG. 1 is a block diagram showing an organic light emitting display device according to an exemplary embodiment of the present invention.
Figure 2:
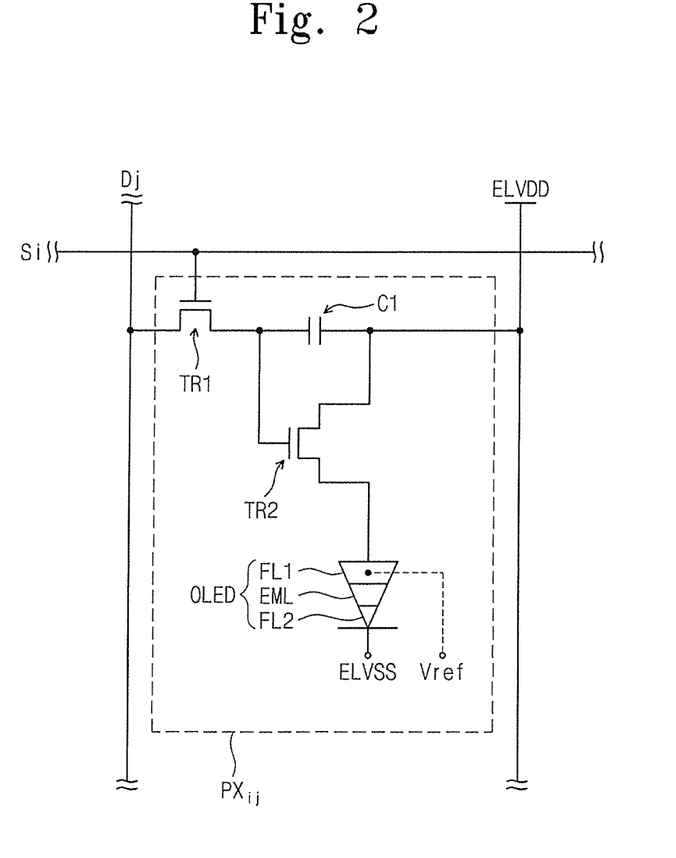
FIG. 2 is an equivalent circuit diagram of a pixel shown in FIG. 1.

FIG. 1 is a block diagram showing an organic light emitting display device according to an exemplary embodiment of the present invention, and FIG. 2 is an equivalent circuit diagram of a pixel shown in FIG. 1.

Referring to FIG. 1, an organic light emitting display device includes a display panel DP, a timing controller 100, a scan driver 200, and a data driver 300.

The display panel DP includes a plurality of scan lines S1 to Sn, a plurality of data lines D1 to Dm, and a plurality of pixels $PX_{11}$ to $PX_{nm}$, each of which is connected to a corresponding scan line of the scan lines S1 to Sn and a corresponding data line of the data lines D1 to Dm.

The display panel DP includes at least one substrate (not shown). The scan lines S1 to Sn and the data lines D1 to Dm are disposed on the substrate. The scan lines S1 to Sn are extended in a direction different from a direction in which the data lines D1 to Dm are extended, and the scan lines S1 to Sn are insulated from the data lines D1 to Dm.

The display panel DP receives a first source voltage ELVDD and a second source voltage ELVSS. Each of the pixels $PX_{11}$ to $PX_{nm}$ receives the first source voltage ELVDD and the second source voltage ELVSS, and generates light in response to a corresponding data signal. The first source voltage ELVDD has a voltage level higher than that of the second source voltage ELVSS.

The timing controller 100 receives input image signals and converts the input image signals to image data appropriate to the operating condition of the display panel, and the timing controller 100 outputs the image data and various control signals.

The scan driver 200 receives a scan driving control signal SCS from the timing controller 100 and generates a plurality of scan signals. The scan driver 200 sequentially applies the scan signals to the scan lines S1 to Sn.

The data driver 300 receives a data driving control signal DCS and the image data $1_{DATA}$ from the timing controller 100. The data driver 300 generates a plurality of data signals on the basis of the data driving control signal DCS and the image data $1_{DATA}$. The data signals are applied to the data lines D1 to Dm.

FIG. 2 shows the equivalent circuit diagram of a pixel $PX_{ij}$ connected to an i-th scan line Si and a j-th data line Dj as an example. Here, FIG. 2 shows the equivalent circuit diagram of one pixel $PX_{ij}$, but each of the pixels $PX_{11}$ to $PX_{nm}$ has substantially the same equivalent circuit diagram as shown in FIG. 2.

The pixel $PX_{ij}$ includes a first transistor TR1, a second transistor TR2, a capacitor C1, and an organic light emitting diode OLED.

The first transistor TR1 includes a gate electrode connected to the i-th scan line Si, a source electrode connected to the j-th data line Dj, and a drain electrode. The first transistor TR1 outputs the data signal applied to the j-th data line Dj in response to the scan signal applied to the i-th scan line Si.

The capacitor C1 includes a first electrode connected to the first transistor TR1 and a second electrode applied with the first source voltage ELVDD. The capacitor C1 is charged with a voltage equal to a voltage difference between a voltage corresponding to the data signal from the first transistor TR1 and the first source voltage ELVDD.

The second transistor TR2 includes a gate electrode connected to the drain electrode of the first transistor TR1 and the first electrode of the capacitor C1, a source electrode applied with the first source voltage ELVDD, and a drain electrode. The drain electrode of the second transistor TR2 is connected to the organic light emitting diode OLED.

The second transistor TR2 applies the first source voltage ELVDD to the organic light emitting diode in response to the voltage charged in the capacitor C1. The capacitor C1 maintains a turn-on period of the second transistor TR2.

The organic light emitting diode OLED includes a first electrode (not shown) connected to the second transistor TR2 and a second electrode (not shown) applied with the second source voltage ELVSS. The organic light emitting diode OLED further includes a first common layer FL1, an organic light emitting layer EML, and a second common layer FL2, which are disposed between the first electrode and the second electrode of the OLED. The organic light emitting diode OLED emits light during the turn-on period of the second transistor TR2 and does not emit light during the turn-off period of the second transistor TR2.

During the turn-off period of the second transistor TR2, a leakage current can occur. The leakage current of the second transistor TR2 is applied to the organic light emitting diode OLED. Therefore, the organic light emitting diode OLED generates light corresponding to the leakage current.

The first common layers FL1 of the organic light emitting diodes OLEDs included in the pixels $PX_{11}$ to PXnm are connected to each other. That is, the first common layers FL1 of the pixels $PX_{11}$ to PXnm are integrally formed as a single unitary and individual unit or layer.

For the convenience of explanation, the organic light emitting diode OLED shown in FIG. 2 has been described that the organic light emitting diode OLED emits light caused by the leakage current of the second transistor TR2 of the pixel $PX_{ij}$, but the leakage current may be transmitted to the pixels adjacent to the pixel $PX_{ij}$ along the first common layers FL1. In other words, the leakage current that causes the light emission of the pixel $PX_{ij}$ shown in FIG. 2 may be the leakage current generated by the adjacent pixels rather than the leakage current generated by the second transistor TR2 of the pixel $PX_{ij}$.

To prevent the light corresponding to the leakage current from being generated, the organic light emitting diode OLED is applied with a reference voltage Vref. In more detail, the reference voltage Vref is applied to the first common layer FL1 of the organic light emitting diode OLED.

The reference voltage Vref may be a ground voltage. In addition, the reference voltage Vref may have the same voltage level as the second source voltage ELVSS. In one embodiment, the reference voltage Vref may have the voltage level set by the following Equation 1.

$$-1V \leq (\text{second source voltage} - \text{reference voltage}) \leq 1V \quad \text{Equation 1}$$

The leakage current is grounded to a source supplying the reference voltage Vref without being transmitted to the organic light emitting diode OLED. Accordingly, the light corresponding to the leakage current is not generated.

Figure 3:
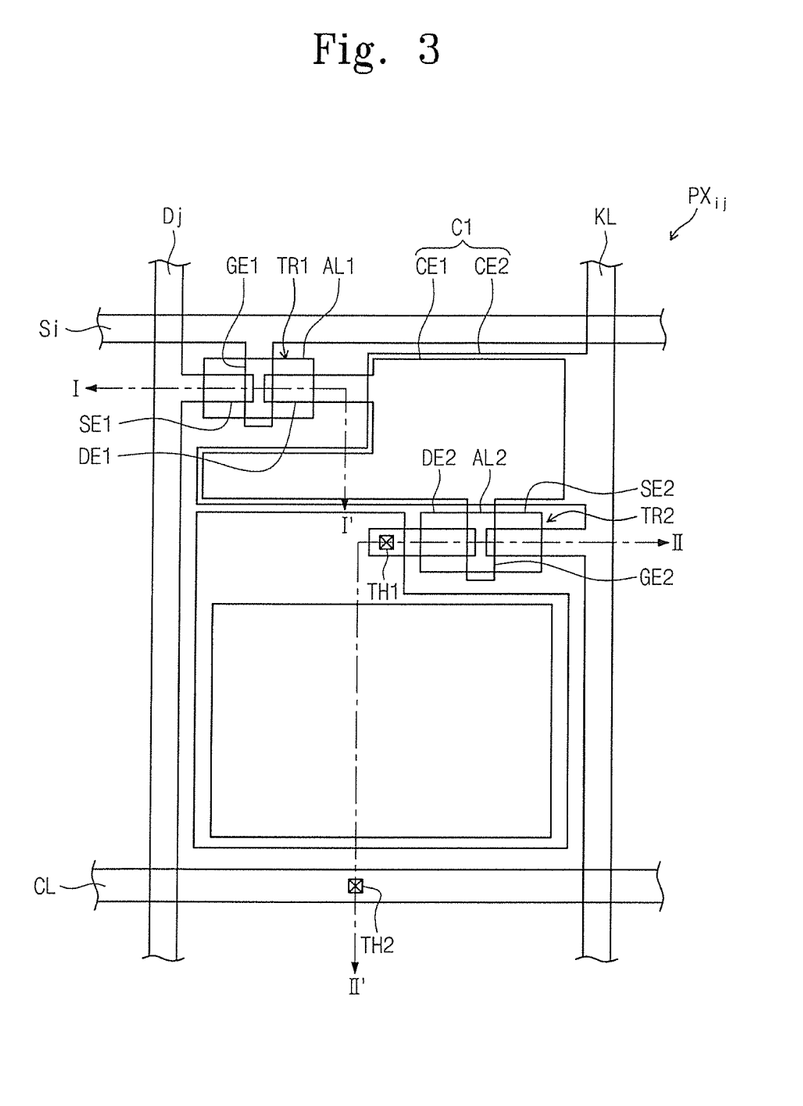
FIG. 3 is a plan view showing a layout of the pixel shown in FIG. 2.
Figure 4A:
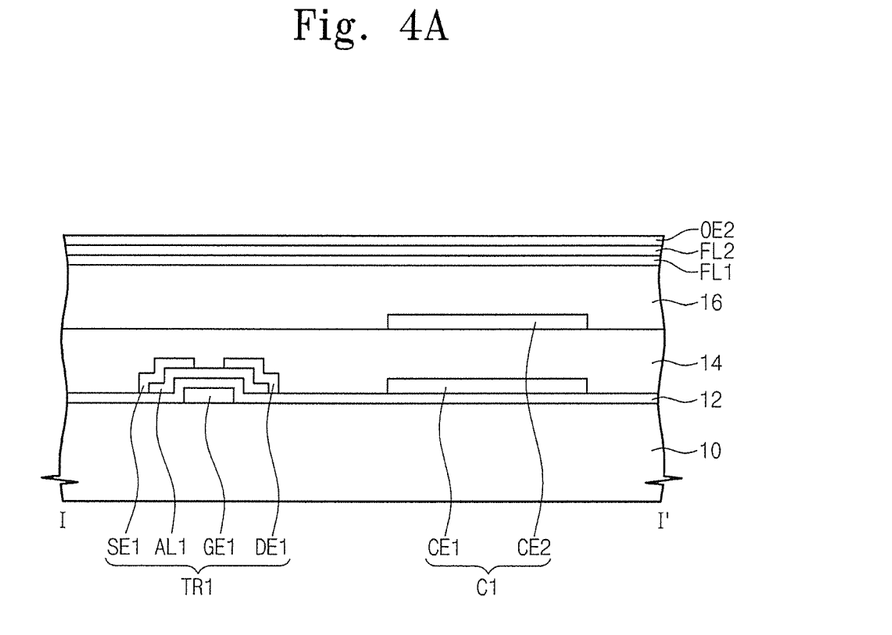
FIGS. 4A and 4B are cross-sectional views showing a portion of the pixel shown in FIG. 3.
Figure 4B:
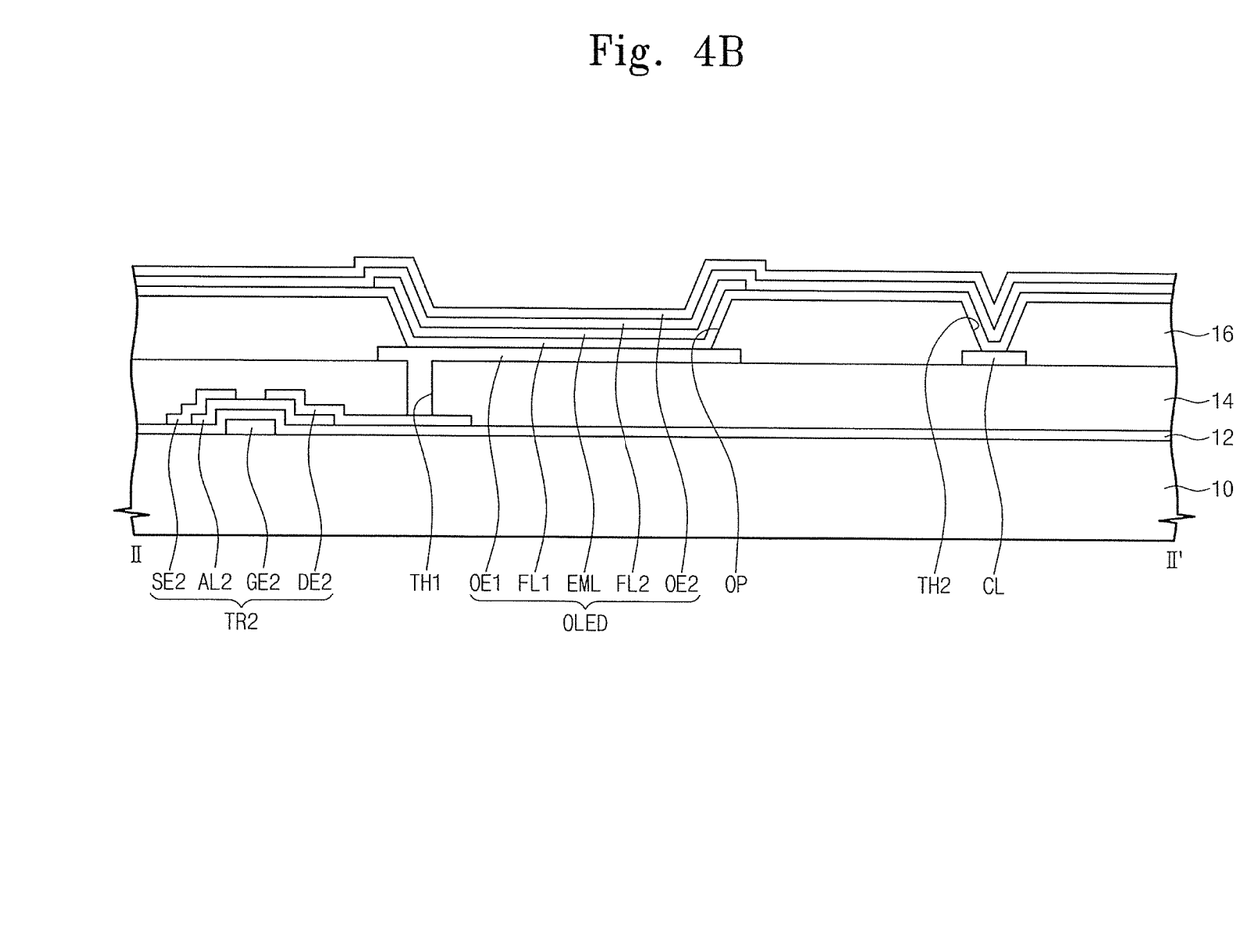

FIG. 3 is a plan view showing a layout of the pixel shown in FIG. 2 and FIGS. 4A and 4B are cross-sectional views showing a portion of the pixel shown in FIG. 3. FIG. 3 does not show the first common layer, the second common layer, and the second electrode of the organic light emitting diode.

Referring to FIGS. 3, 4A, and 4B, the i-th scan line Si and the j-th data line Dj are disposed on the first substrate 10 to be insulated from each other while crossing each other. In addition, a source voltage line KL applied with the first source voltage ELVDD and a common line CL applied with the reference voltage Vref are disposed on the first substrate 10.

The gate electrode GE1 (hereinafter, referred to as first gate electrode) of the first transistor TR1 is branched from the i-th scan line Si. A first insulating layer 12 is disposed on the first substrate 10 to cover the i-th scan line Si. The first insulating layer 12 includes an organic layer and/or an inorganic layer.

A semiconductor layer AU (hereinafter, referred to as first semiconductor layer) of the first transistor TR1 is disposed on the first gate electrode GE1 while interposing the first insulating layer 12 therebetween. The source electrode SE1 (hereinafter, referred to as first source electrode) and the drain electrode DE1 (hereinafter, referred to as first drain electrode) of the first transistor TR1 are disposed to overlap with the first semiconductor layer AL1. The first source electrode SE1 and the first drain electrode DE1 are disposed to be spaced apart from each other.

The first electrode CE1 of the capacitor C1 is disposed on the first insulating layer 12. The first electrode CE1 of the capacitor C1 is connected to the first drain electrode DE1.

A second insulating layer 14 is disposed on the first insulating layer 12 to cover the first source electrode SE1, the first drain electrode DE1, and the first electrode CE1 of the capacitor C1.

The second electrode CE2 of the capacitor C1 is disposed on the second insulating layer 14, and the second electrode CE2 is connected to the source voltage line KL.

The gate electrode GE2 (hereinafter, referred to as second gate electrode) of the second transistor TR2 is connected to the first electrode CE1 of the capacitor C1. A semiconductor layer AL2 (hereinafter, referred to as second semiconductor layer) of the second transistor TR2 is disposed on the second gate electrode GE2 while interposing the first insulating layer 12 therebetween. The source electrode SE2 (hereinafter, referred to as second source electrode) and the drain electrode DE2 (hereinafter, referred to as second drain electrode) of the second transistor TR2 are disposed to overlap with the second semiconductor layer AL2. The second source electrode SE2 and the second drain electrode DE2 are disposed to be spaced apart from each other. The second insulating layer 14 covers the second source electrode SE2 and the second drain electrode DE2.

The organic light emitting diode OLED is disposed on the second insulating layer 14. In more detail, a first electrode OE1 of the organic light emitting diode OLED is disposed on the second insulating layer 14, the first common layer FL1 is disposed on the first electrode OE1, the organic light emitting layer EML is disposed on the first common layer FL1, the second common layer FL2 is disposed on the organic light emitting layer EML, and a second electrode OE2 of the organic light emitting diode OLED is disposed on the second common layer FL2. In several embodiments, the second common layer FL2 may be omitted.

FIGS. 3, 4A, and 4B show one pixel $PX_{ij}$ of the pixels PX11 to $PX_{nm}$ that include the first common layers FL1 integrally formed as a single unitary and individual unit as an example.

The first electrode OE1 is electrically connected to the second drain electrode DE2 through a first contact hole TH1 penetrating the second insulating layer 14. The first electrode OE1 may be a positive or negative electrode. In the present exemplary embodiment, the first electrode OE1 will be described as the positive electrode.

The first common layer FL1 includes a hole injection layer. In addition, the first common layer FL1 further includes a hole transport layer disposed on the hole injection layer. The second common layer FL2 includes an electron injection layer. In addition, the second common layer FL2 further includes an electron transport layer disposed between the organic light emitting layer EML and the electron injection layer.

A third insulating layer 16 is disposed on the second insulating layer 14. The third insulating layer 16 covers the second electrode CE2 of the capacitor C1. The third insulating layer 16 is provided with an opening OP formed therethrough to expose the first electrode OE1 of the organic light emitting diode OLED. A side surface of the third insulating layer 16, which defines the opening OP, may be inclined with respect to the first electrode OE1.

The first common layer FL1 is disposed on the third insulating layer 16. The first common layer FL1 makes contact with the first electrode OE1 through the opening OP. The first common layer FL1 is disposed on the first electrode OE1 exposed through the opening OP, the side surface of the third insulating layer 16, and an upper surface of the third insulating layer 16.

The organic light emitting layer EML is disposed on the first common layer FL1 to correspond to the opening OP. The second common layer FL2 is disposed on the first common layer FL1. The second common layer FL2 covers the organic light emitting layer EML. The second electrode OE2 is disposed on the second common layer FL2.

The common line CL is disposed on the second insulating layer 14. A portion of the first common layer FL1 makes contact with the common line CL. In more detail, the portion of the first common layer FL1 makes contact with the common line CL through a second contact hole TH2 formed through the third insulating layer 16.

The leakage current generated during the turn-off period of the second transistor TR2 is grounded to the common line CL through the first common layer FL1. Accordingly, the organic light emitting diode OLED does not emit light during the turn-off period of the second transistor TR2 since the leakage current is grounded to the common line CL.

Although not shown in the figures, another insulating layer and another substrate may be disposed on the third insulating layer 16. The insulating layer may be transparent or have one or more of red, green, and blue colors. In addition, the substrate may be a sealing substrate to protect the pixels.

Figure 5A:
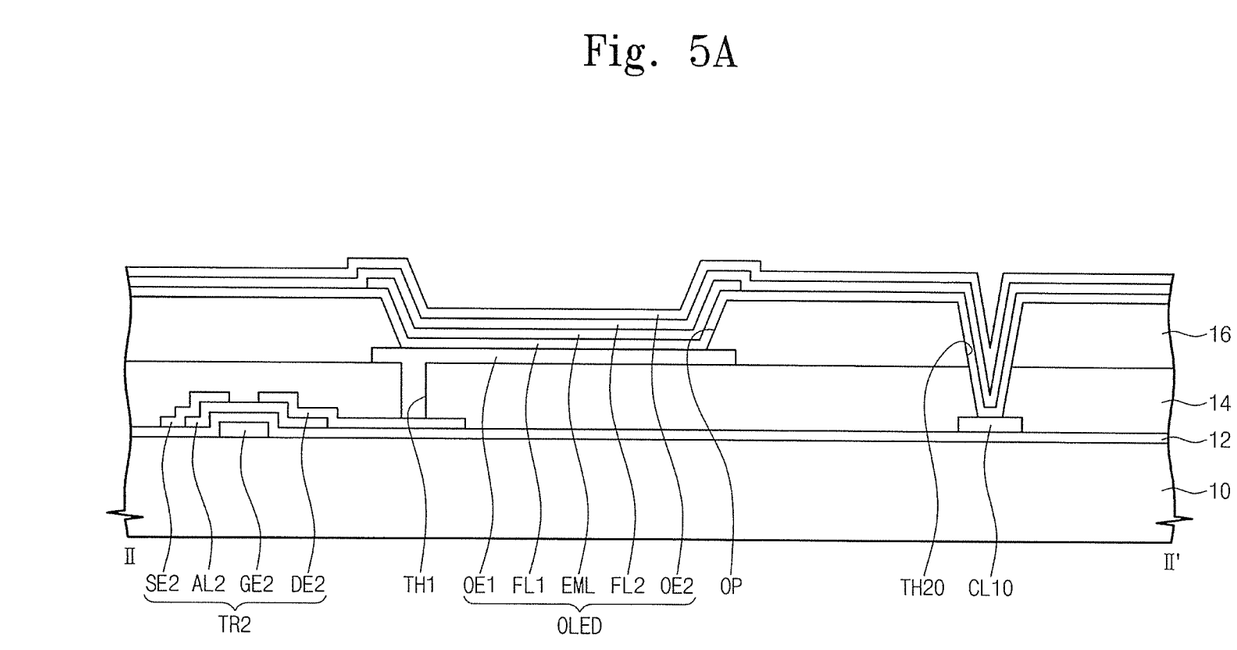
FIGS. 5A and 5B are cross-sectional views showing a portion of a pixel according to another exemplary embodiment of the present invention.
Figure 5B:
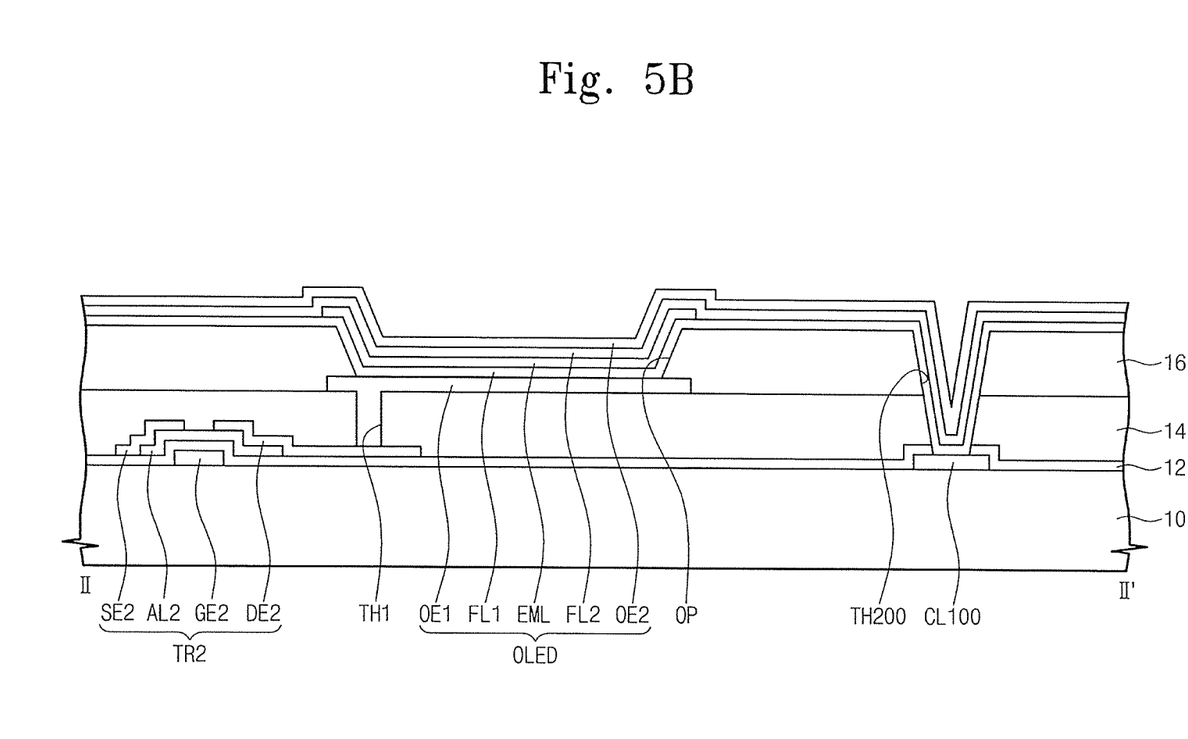

FIGS. 5A and 5B are cross-sectional views showing a portion of a pixel according to another exemplary embodiment of the present invention.

As shown in FIG. 5A, a common line CL10 is disposed on a surface of the first insulating layer 12. That is, the common line CL10 is disposed on the same layer as the second drain electrode DE2. The common line CL10 is formed of the same material as the second drain electrode DE2. In this case, a second contact hole TH20 is formed through the third insulating layer 16 and the second insulating layer 14.

As shown in FIG. 5B, a common line CL100 is disposed on a surface of the first substrate 10. That is, the common line CL100 is disposed on the same layer as the second gate electrode GE2. The common line CL100 is formed of the same material as the gate electrode GE2. In this case, a second contact hole TH200 is formed through the third insulating layer 16, the second insulating layer 14, and the first insulating layer 12.

Figure 6:
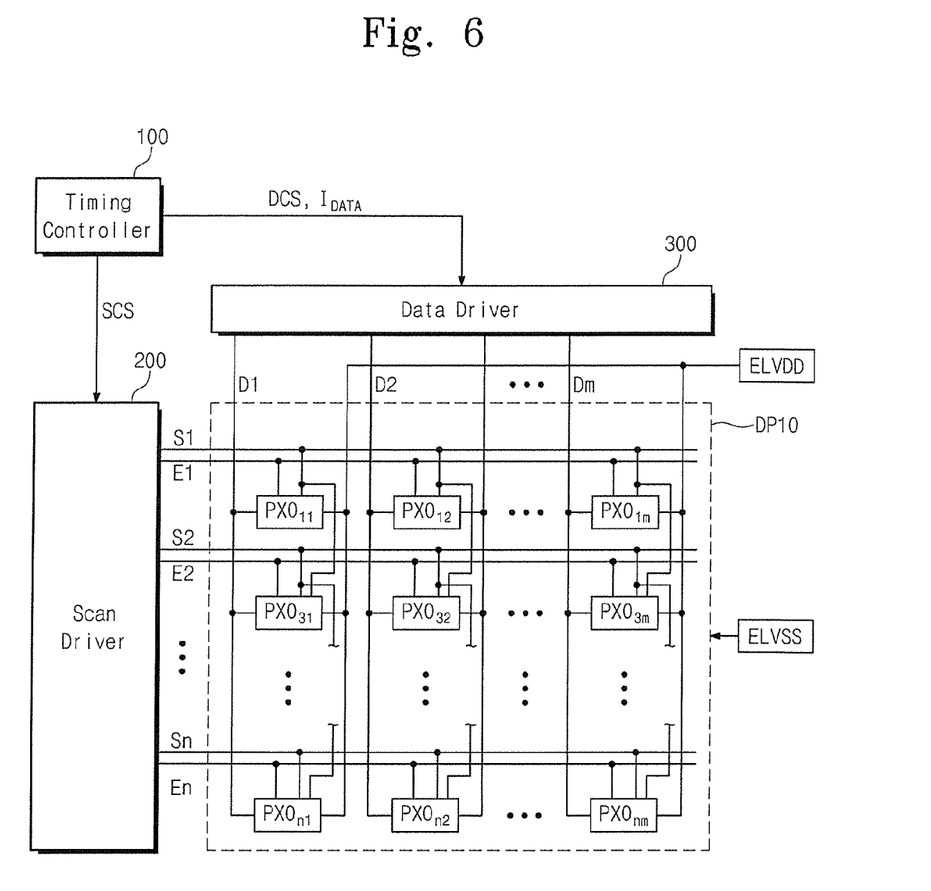
FIG. 6 is a block diagram showing an organic light emitting display device according to an exemplary embodiment of the present invention.
Figure 7:
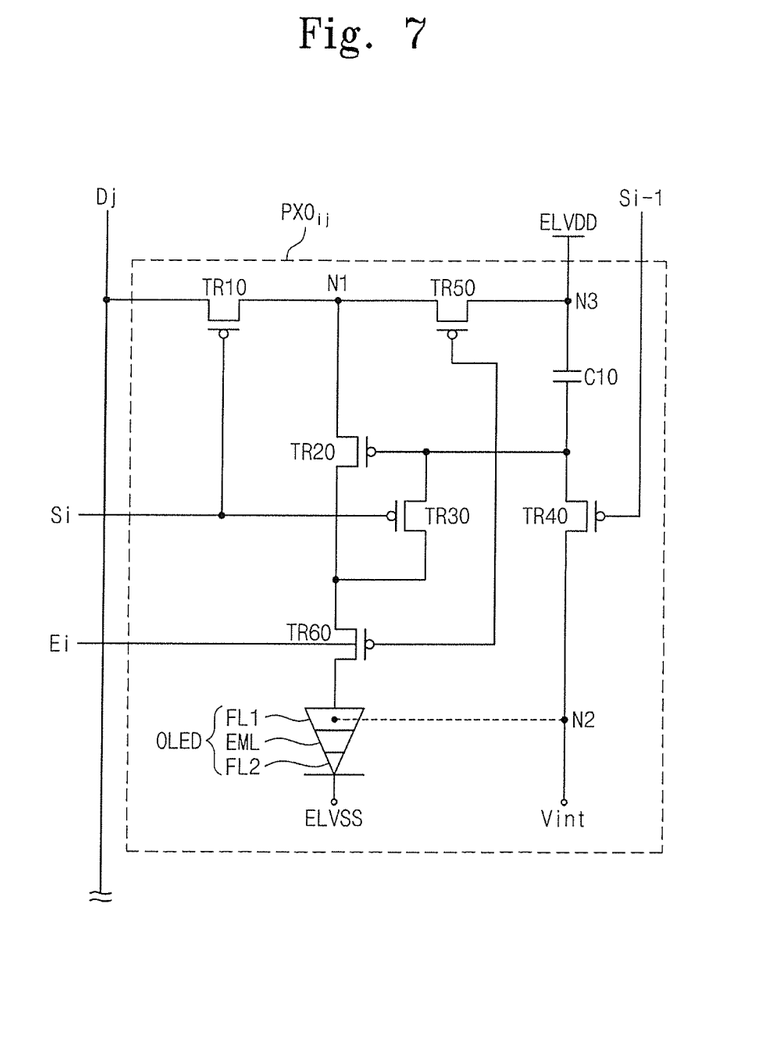
FIG. 7 is an equivalent circuit diagram of a pixel shown in FIG. 6.
Figure 8:
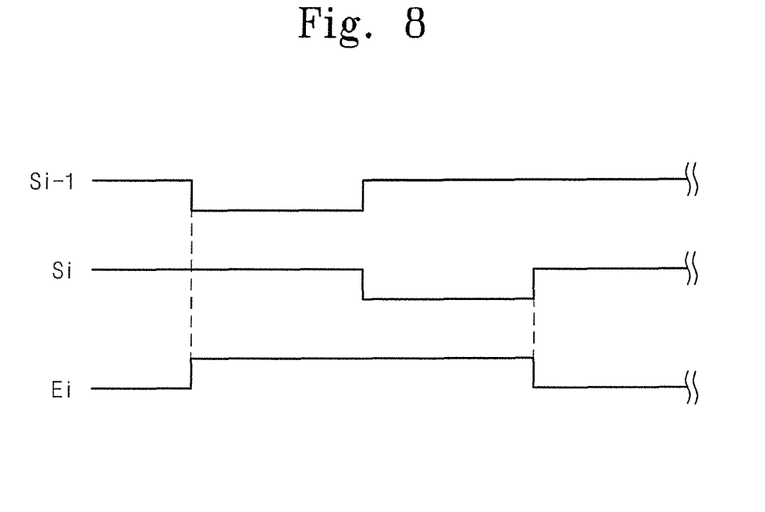
FIG. 8 is a timing diagram of signals applied to the pixel shown in FIG. 7.
Figure 9:
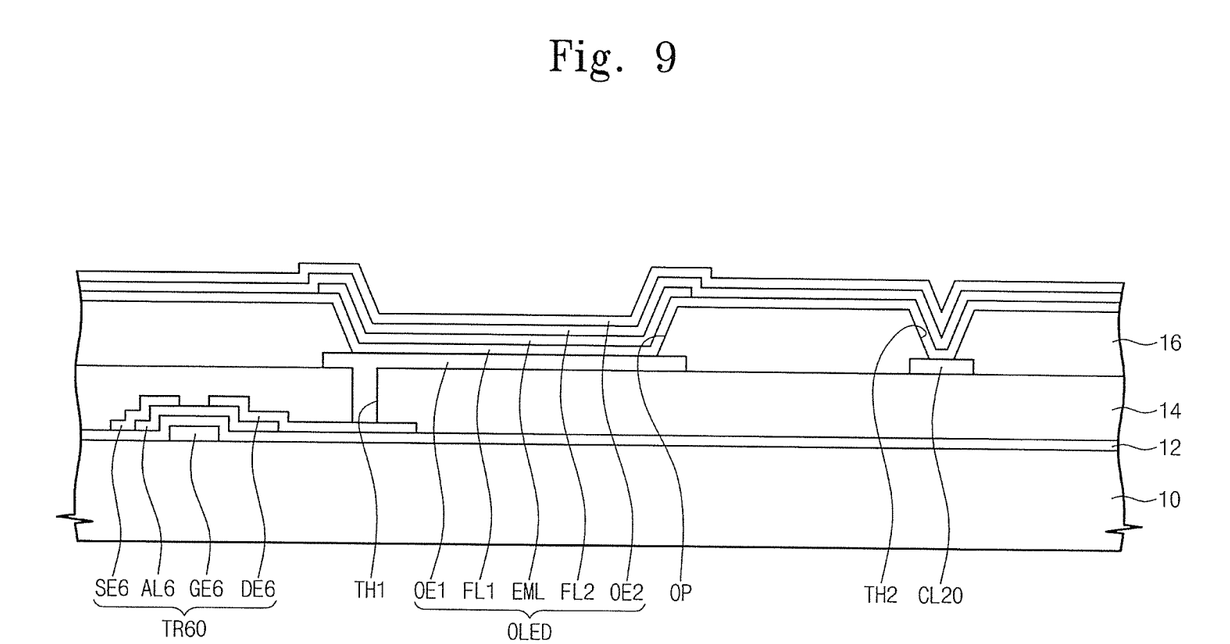
FIG. 9 is a cross-sectional view showing a portion of the pixel shown in FIG. 7.

FIG. 6 is a block diagram showing an organic light emitting display device according to an exemplary embodiment of the present invention, and FIG. 7 is an equivalent circuit diagram of a pixel shown in FIG. 6. FIG. 8 is a timing diagram of signals applied to the pixel shown in FIG. 7, and FIG. 9 is a cross-sectional view showing a portion of the pixel shown in FIG. 7.

Hereinafter, the organic light emitting display device according to the exemplary embodiment will be described with reference to FIGS. 6 to 9. In FIGS. 6 to 9, the same reference numerals denote the same elements in FIGS. 1 to 5B, and thus detailed descriptions of the same elements will be omitted.

Referring to FIG. 6, the organic light emitting display device includes a display panel DP10, a timing controller 100, a scan driver 200, and a data driver 300.

The display panel DP10 includes a plurality of scan lines S1 to Sn, a plurality of data lines D1 to Dm, a plurality of control lines E1 to En, and a plurality of pixels $PXO_{11}$ to $PXO_{nm}$. Each of the pixels $PXO_{11}$ to $PXO_{nm}$ is connected to a corresponding control line of the control lines E1 to En, a corresponding scan line of the scan lines S1 to Sn, and a corresponding data line of the data lines D1 to Dm.

The scan driver 200 generates a plurality of scan signals and sequentially applies the scan signals to the scan lines S1 to Sn. In addition, the scan driver 200 generates a plurality of light emitting control signals in response to the scan driving control signal SCS and sequentially applies the light emitting control signals to the control lines E1 to En. In the present exemplary embodiment, a high period (e.g., a logic-high period) of each of the light emitting control signals has a width set equal to or longer than a width of a high period of each of the scan signals.

Each of the pixels $PXO_{11}$ to $PXO_{nm}$ receives the first source voltage ELVDD and the second source voltage ELVSS. Each of the pixels $PXO_{11}$ to $PXO_{nm}$ generates light corresponding to the data signal. In this case, a light emitting time of each of the pixels $PXO_{11}$ to $PXO_{nm}$ is controlled by a corresponding light emitting control signal of the light emitting control signals.

Among the pixels $PXO_{11}$ to $PXO_{nm}$, pixels arranged in an i-th pixel row are electrically connected to pixels arranged in an (i+1)th pixel row. The pixels arranged in the i-th pixel row are connected to an i-th scan line, and the pixels arranged in the (i+1)th pixel row are connected to an (i+1)th scan line. For instance, the pixels connected to a first scan line S1 are electrically connected to the pixels connected to a second scan line S2.

Referring to FIG. 7, a pixel $PXO_{ij}$ includes first, second, third, fourth, fifth, and sixth transistors TR10, TR20, TR30, TR40, TR50, and TR60, an organic light emitting diode OLED, and a capacitor C10. The number of the transistors and the number of the capacitors, which are included in the pixel $PXO_{ij}$, should not be limited thereto or thereby.

The first transistor TR10 includes a gate electrode connected to the i-th scan line Si, a source electrode connected to the j-th data line Dj, and a drain electrode connected to a first node N1. The first transistor TR10 outputs the data signal applied to the j-th data line Dj to the first node N1 in response to the scan signal applied to the i-th scan line Si.

The second transistor TR20 includes a source electrode connected to the first node N1, a drain electrode connected to the sixth transistor TR60, and a gate electrode connected to a first electrode of the capacitor C10. The second transistor TR20 applies a current according to the voltage charged in the capacitor C10 to the organic light emitting diode OLED.

The third transistor TR30 includes a source electrode connected to the drain electrode of the second transistor TR20, a drain electrode connected to the gate electrode of the second transistor TR20, and a gate electrode connected to the i-th scan line Si. The third transistor TR30 is turned on in response to the scan signal applied to the i-th scan line Si, and thus the second transistor TR20 is connected in a diode configuration (diode-connected).

The fourth transistor TR40 includes a gate electrode connected to an (i−1)th scan line Si−1, a drain electrode connected to a second node N2 to which an initialization voltage Vint is applied, and a source electrode connected to the first electrode of the capacitor C10. The fourth transistor TR40 initializes the voltage of the first electrode of the capacitor C10 and the voltage of the gate electrode of the second transistor TR20 to the initialization voltage Vint in response to the scan signal applied to the (i−1)th scan line Si−1.

The fifth transistor TR50 includes a source electrode connected to a third node N3 applied with the first source voltage ELVDD, a drain electrode connected to the first node N1, and a gate electrode connected to an i-th control line Ei. The fifth transistor TR50 is turned on during a low period (e.g., a logic-low period) of the light emitting control signal applied to the i-th control line Ei and applies the first source voltage ELVDD to the first node N1.

The sixth transistor TR60 includes a source electrode connected to the drain electrode of the second transistor TR20, a drain electrode connected to the organic light emitting diode OLED, and a gate electrode connected to the i-th control line Ei. The sixth transistor TR60 is turned on during the low period of the light emitting control signal applied to the i-th control line Ei and applies the current from the second transistor TR20 to the organic light emitting diode OLED. The sixth transistor TR60 is turned off during a high period (e.g., a logic-high period) of the light emitting control signal applied to the i-th control line Ei.

The capacitor C10 includes a first electrode connected to the gate electrode of the second transistor TR20 and a second electrode connected to the third node N3. The capacitor C10 is charged with a voltage corresponding to a threshold voltage of the second transistor TR20 and the data signal applied to the j-th data line.

Hereinafter, an operation of the pixel PXO$_{ij}$ will be described in detail with reference to FIGS. 7 and 8. The fifth transistor TR50 and the sixth transistor TR60 are turned off during the high period of the light emitting control signal applied to the i-th control line Ei. In this case, since the first source voltage ELVDD is not applied to the second transistor TR20, the organic light emitting diode OLED does not emit light.

The fourth transistor TR40 is turned on during the low period of the scan signal applied to the (i−1)th scan line Si−1. When the fourth transistor TR40 is turned on, the initialization voltage Vint is applied to the first electrode of the capacitor C10 and the gate electrode of the second transistor TR20. In other words, when the fourth transistor TR40 is turned on, the voltage of the first electrode of the capacitor C10 and the voltage of the gate electrode of the second transistor TR20 are initialized to the initialization voltage Vint. In the present exemplary embodiment, the initialization voltage Vint has the voltage level lower than that of the voltage corresponding to the data signal.

The initialization voltage Vint may be the ground voltage. In addition, the initialization voltage Vint may have the voltage level set by the following Equation 2.

$$-1V \leq \text{(second source voltage−initialization voltage)} \leq 1V$$
Equation 2

Then, when the scan signal applied to the (i−1)th scan line Si−1 is in the high period, the scan signal applied to the i-th scan line Si has the high period. The first transistor TR10 and the third transistor TR30 are turned on during the low period of the scan signal applied to the i-th scan line Si. When the third transistor TR30 is turned on, the first transistor TR10 is connected in a diode configuration.

When the first transistor TR10 is turned on, the data signal applied to the j-th data line Dj is applied to the first node N1 through the first transistor TR10. In this case, since the voltage of the gate electrode of the second transistor TR20 is set to the initialization voltage Vint, the second transistor TR20 is turned on.

When the second transistor TR20 is turned on, the data signal applied to the first node N1 is applied to the first electrode of the capacitor C10 through the second transistor TR20 and the third transistor TR30. The capacitor C10 is charged with a voltage corresponding to a sum of the voltage corresponding to the data signal and the threshold voltage of the second transistor TR20.

After the capacitor C10 is charged, the fifth transistor TR50 and the sixth transistor TR60 are turned on during the low period of the light emitting control signal.

When the fifth transistor TR50 and the sixth transistor TR60 are turned on, a current path is formed between the third node N3 and the organic light emitting diode OLED. The amount of the current flowing to the organic light emitting diode OLED from the first source voltage ELVDD is controlled by the voltage applied to the gate electrode of the second transistor TR20.

The leakage current may be generated during a period in which the sixth transistor TR60 is turned off. When the leakage current in the sixth transistor TR60 is transmitted to the organic light emitting diode OLED, the organic light emitting diode OLED generates light corresponding to the leakage current.

To prevent the light corresponding to the leakage current from being generated, a reference voltage is applied to the organic light emitting diode OLED. In more detail, the reference voltage is applied to the first common layer FL1 disposed between the first electrode of the organic light emitting diode OLED and the organic light emitting layer EML. In the present exemplary embodiment, the reference voltage is the initialization voltage Vint.

Referring to FIG. 9, a common line CL20 is disposed on the first substrate 10 to receive the initialization voltage Vint.

The gate electrode GE6 of the sixth transistor TR60 is disposed on the first substrate 10. A semiconductor layer AL6 of the sixth transistor TR60 is disposed on the gate electrode GE6 while interposing the first insulating layer 12 therebetween. The source electrode SE6 and the drain electrode DE6 are disposed to be overlapped with the semiconductor layer AL6. The second insulating layer 14 covers the source electrode SE6 and the drain electrode DE6.

The organic light emitting diode OLED and the common line CL20 are disposed on the second insulating layer 14. The first electrode OE1 of the organic light emitting diode OLED is disposed on the second insulating layer 14, the first common layer FL1 is disposed on the first electrode OE1, the organic light emitting layer EML is disposed on the first common layer FL1, the second common layer FL2 is disposed on the organic light emitting layer EML, and the second electrode OE2 of the organic light emitting diode OLED is disposed on the second common layer FL2. The common line CL20 may be disposed on different layers as shown in FIGS. 5A and 5B.

A third insulating layer 16 is disposed on the second insulating layer 14. The third insulating layer 16 is provided with an opening OP formed therethrough to expose the first electrode OE1 of the organic light emitting diode OLED. The first common layer FL1 is disposed on the third insulating layer 16.

A portion of the first common layer FL1 makes contact with the common line CL20 disposed on the second insulating layer 14. In more detail, the portion of the first common layer FL1 makes contact with the common line CL20 through a second contact hole TH2 formed through the third insulating layer 16.

The leakage current generated during the turn-off period of the sixth transistor TR60 is grounded to the common line CL20 through the first common layer FL1. Thus, the organic light emitting diode OLED does not generate light during the turn-off period of the sixth transistor TR60 even though the leakage current is generated during the turn-off period of the sixth transistor TR60.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed and equivalents thereof.

What is claimed is:

1. A pixel comprising:
   a transistor configured to output a first source voltage;
   an organic light emitting diode coupled to the transistor; and
   a wiring applied with a reference voltage to ground a leakage current of the transistor,
   wherein the organic light emitting diode comprises:

a first electrode configured to receive the first source voltage;

a first common layer on the first electrode, wherein the wiring is configured to apply the reference voltage to the first common layer;

an organic light emitting layer on the first common layer; and a second electrode on the organic light emitting layer and configured to be applied with a second source voltage different from the first source voltage, wherein the first common layer is directly coupled to the wiring.

2. The pixel of claim 1, wherein the first common layer comprises a hole injection layer.

3. The pixel of claim 2, wherein the first common layer further comprises a hole transport layer between the hole injection layer and the organic light emitting layer.

4. The pixel of claim 2, wherein the organic light emitting diode further comprises an electron injection layer between the organic light emitting layer and the second electrode.

5. The pixel of claim 4, wherein the organic light emitting diode further comprises an electron transport layer between the organic light emitting layer and the electron injection layer.

6. The pixel of claim 2, wherein the wiring is located on a same layer as the first electrode.

7. An organic light emitting display device comprising:

a substrate comprising a plurality of scan lines and a plurality of data lines insulated from the scan lines and crossing the scan lines; and a plurality of pixels, each of the pixels comprising an organic light emitting diode (OLED) configured to be applied with a first source voltage and a second source voltage lower than the first source voltage, and being coupled to a corresponding scan line of the scan lines and a corresponding data line of the data lines, the organic light emitting diode comprising:

a first electrode configured to receive the first source voltage;

a first common layer on the first electrode;

an organic light emitting layer on the first common layer; and a second electrode on the organic light emitting layer and configured to be applied with the second source voltage, wherein the first common layer is configured to directly receive a reference voltage to prevent the organic light emitting layer from emitting a light caused by a leakage current of a driving transistor of the OLED.

8. The organic light emitting display device of claim 7, wherein the first common layer comprises a hole injection layer.

9. The organic light emitting display device of claim 8, wherein the first common layer further comprises a hole transport layer between the hole injection layer and the organic light emitting layer.

10. The organic light emitting display device of claim 8, wherein the organic light emitting diode further comprises an electron injection layer between the organic light emitting layer and the second electrode.

11. The organic light emitting display device of claim 10, wherein the organic light emitting diode further comprises an electron transport layer between the organic light emitting layer and the electron injection layer.

12. The organic light emitting display device of claim 7, wherein, among the pixels, a pixel coupled to an i-th (i is an integer equal to or greater than 2) scan line of the scan lines and a j-th data line (j is an integer equal to or greater than 2) of the data lines, comprises:

a first transistor coupled to the i-th scan line and the j-th data line;

a capacitor comprising a first electrode coupled to the first transistor and a second electrode configured to be applied with the first source voltage; and a second transistor coupled to the first transistor, the capacitor, and the organic light emitting diode.

13. The organic light emitting display device of claim 12, wherein the second transistor comprises:

a gate electrode on the substrate;

a semiconductor layer overlapped with the gate electrode with a first insulating layer interposing therebetween;

a source electrode overlapped with the semiconductor layer; and a drain electrode overlapped with the semiconductor layer, spaced apart from the source electrode, and electrically coupled to the first electrode of the organic light emitting diode.

14. The organic light emitting display device of claim 13, wherein the substrate further comprises a common line configured to be applied with the reference voltage and being on a same layer as the gate electrode.

15. The organic light emitting display device of claim 13, wherein the substrate further comprises a common line configured to be applied with the reference voltage and being on a same layer as the source electrode.

16. The organic light emitting display device of claim 13, wherein the substrate further comprises a second insulating layer covering the source electrode and the drain electrode of the second transistor, and a common line configured to receive the reference voltage, and wherein the first electrode of the organic light emitting diode and the common line are on the second insulating layer.

17. The organic light emitting display device of claim 7, wherein, among the pixels, a pixel coupled to an i-th (i is an integer equal to or greater than 2) scan line of the scan lines and a j-th data line (j is an integer equal to or greater than 2) of the data lines, comprises:

a first transistor coupled to the i-th scan line and the j-th data line and configured to be turned on in response to a scan signal applied to the i-th scan line;

a second transistor coupled to the first transistor to control an amount of a current provided to the organic light emitting diode;

a third transistor coupled between a gate electrode of the second transistor and an output electrode of the second transistor, and configured to be turned on in response to the scan signal applied to the i-th scan line;

a fourth transistor configured to output the reference voltage in response to the scan signal applied to an (i−1)th scan line of the scan lines;

a fifth transistor configured to apply the first source voltage to the second transistor in response to a light emitting control signal of the organic light emitting diode;

a sixth transistor configured to apply the first source voltage from the second transistor to the organic light emitting diode in response to the light emitting control signal of the organic light emitting diode; and a capacitor comprising a first electrode coupled to the fourth transistor and a second electrode configured to be applied with the first source voltage.

18. The organic light emitting display device of claim 17, wherein the sixth transistor comprises:

a gate electrode on the substrate;

a semiconductor layer overlapped with the gate electrode with a first insulating layer interposing therebetween;

a source electrode overlapped with the semiconductor layer; and a drain electrode overlapped with the semiconductor layer, spaced apart from the source electrode, and electrically coupled to the first electrode of the organic light emitting diode.

19. The organic light emitting display device of claim 18, wherein the substrate further comprises a common line configured to be applied with the reference voltage and coupled to a source electrode of the fourth transistor, and wherein the common line is on a same layer as the source electrode or the gate electrode.

20. The organic light emitting display device of claim 18, wherein the substrate further comprises a second insulating layer to cover the source electrode and the drain electrode of the sixth transistor, and a common line configured to be applied with the reference voltage and coupled to the source electrode of the fourth transistor, and wherein the first electrode and the common line are on the second insulating layer.

\* \* \* \* \*